US012531207B2

(12) United States Patent
Kusunoki

(10) Patent No.: US 12,531,207 B2
(45) Date of Patent: Jan. 20, 2026

(54) PLASMA PROCESSING SYSTEM AND PLASMA PROCESSING METHOD

(71) Applicant: Tokyo Electron Limited, Tokyo (JP)

(72) Inventor: Atsuki Kusunoki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 209 days.

(21) Appl. No.: 18/215,898

(22) Filed: Jun. 29, 2023

(65) Prior Publication Data

US 2024/0006153 A1 Jan. 4, 2024

(30) Foreign Application Priority Data

Jun. 29, 2022 (JP) ................................ 2022-104778

(51) Int. Cl.
*H01J 37/32* (2006.01)

(52) U.S. Cl.
CPC .............................. *H01J 37/32183* (2013.01)

(58) Field of Classification Search
None
See application file for complete search history.

(56) References Cited

U.S. PATENT DOCUMENTS 10,264,663 B1 * 4/2019 Long ..................... H03F 3/2173
11,610,762 B2 * 3/2023 Kusunoki ......... H01J 37/32146
2007/0193975 A1 * 8/2007 Wilson ............. H01J 37/32706 216/70
2008/0152903 A1 * 6/2008 Von Kaenel ...... H01L 21/02293 118/723 VE
2010/0062613 A1 * 3/2010 Kim .................... H01L 21/0217 438/778
2011/0281435 A1 * 11/2011 Sadjadi ............. H01J 37/32449 257/E21.249
2014/0367043 A1 * 12/2014 Bishara ............. H01J 37/32165 315/111.21
2015/0130354 A1 * 5/2015 Leray ................ H01J 37/32165 315/111.21
2015/0143146 A1 * 5/2015 Eto ................... H01J 37/32724 713/320
2016/0254163 A1 * 9/2016 Tamari .............. H01L 21/67253 438/714
2017/0018405 A1 * 1/2017 Kobayashi ........ H01J 37/32724
(Continued)

FOREIGN PATENT DOCUMENTS

JP 2021-141050 A 9/2021

*Primary Examiner* — Srinivas Sathiraju
(74) *Attorney, Agent, or Firm* — XSENSUS LLP

(57) ABSTRACT

A plasma processing system includes a plasma processing chamber, a substrate support, a matching box, an RF power source, and a controller. The substrate support is disposed in the plasma processing chamber. The matching box is electrically connected to the substrate support. The RF power source is electrically connected to the matching box to generate a periodic RF pulse that includes a first power level, a second power level, and a third power level. The controller calculates the load impedance based on the reflected power of the RF pulse in each of first, second, and third time intervals during which the first, second, and third power levels are supplied, respectively, and controls a matching element included in the matching box based on the load impedance calculated in each of the first, second, and third time intervals.

16 Claims, 7 Drawing Sheets

(56) References Cited

U.S. PATENT DOCUMENTS

| | | | | |
|---|---|---|---|---|
| 2018/0040459 | A1* | 2/2018 | Iwase | H01J 37/321 |
| 2019/0116656 | A1* | 4/2019 | Long | H05H 1/46 |
| 2019/0215942 | A1* | 7/2019 | Long | H01J 37/32174 |
| 2019/0267277 | A1* | 8/2019 | Sasaki | H01L 21/67109 |
| 2019/0362939 | A1* | 11/2019 | Yamagishi | C23C 16/509 |
| 2020/0035470 | A1* | 1/2020 | Ishizawa | H01J 37/32642 |
| 2020/0253034 | A1* | 8/2020 | Long | H05H 1/46 |
| 2022/0051874 | A1* | 2/2022 | Kusunoki | H01J 37/32091 |
| 2023/0215694 | A1* | 7/2023 | Marakhtanov | H03K 3/37 |
| 2023/0230805 | A1* | 7/2023 | Drewery | H01J 37/32146 315/111.21 |
| 2023/0274914 | A1* | 8/2023 | Marakhtanov | H01J 37/32165 361/234 |
| 2023/0282448 | A1* | 9/2023 | Shoeb | H01J 37/32183 315/111.21 |
| 2024/0006153 | A1* | 1/2024 | Kusunoki | H01J 37/32091 |
| 2024/0096600 | A1* | 3/2024 | Voronin | H01J 37/32211 |
| 2024/0395503 | A1* | 11/2024 | Drewery | H01J 37/32146 |

* cited by examiner

PLASMA PROCESSING SYSTEM AND PLASMA PROCESSING METHOD

CROSS-REFERENCE TO RELATED APPLICATION

The present application is based on and claims priority from Japanese Patent Application No. 2022-104778, filed on Jun. 29, 2022, with the Japan Patent Office, the disclosure of which is incorporated herein in its entirety by reference.

TECHNICAL FIELD

The present disclosure relates to various aspects and embodiments of plasma processing systems and methods.

BACKGROUND

In a substrate processing using plasma, the plasma condition affects the accuracy of the substrate processing. As an example, during an etching process using plasma, the condition of the plasma affects the shape of the etching pattern formed on the substrate. The condition of plasma is subject to a change even with the magnitude (power level) of the RF power supplied into the chamber. For example, Japanese Patent Laid-Open Publication No. 2021-141050 discloses a technique of periodically changing RF power to three power levels during an etching process using plasma.

SUMMARY

One aspect of the present disclosure provides a plasma processing system that includes a plasma processing chamber, a substrate support, a matcher, an RF power source, and a controller. The substrate support is disposed in the plasma processing chamber. The matcher is electrically connected to the substrate support. The RF power source is electrically connected to the matcher and generates a periodic RF pulse that includes a first power level, a second power level, and a third power level. The controller calculates the load impedance based on the reflected power of the RF pulse in each of a first time interval during which the first power level is supplied, a second time interval during which the second power level is supplied, and a third time interval during which the third power level is supplied. The controller also controls a matching element included in the matcher based on the load impedance calculated in each of the first time interval, the second time interval, and the third time interval.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Below are detailed descriptions of embodiments implementing a plasma processing system and a plasma processing method, referencing the accompanying drawings. The plasma processing system and plasma processing method described herein are not intended to be restricted to the described embodiments.

Incidentally, fluctuations in the power levels of the RF power supplied to plasma cause alterations to the condition of plasma. These alterations to the condition of plasma, in turn, cause a change in the impedance of plasma, which leads to corresponding changes in the impedance of a load that includes plasma. Thus, it is desirable to control a matching element of a matcher to match the output impedance of a power supply that supplies RF power with the impedance of a load that includes plasma, depending on fluctuations in the power levels of the RF power.

However, the matching element of the matcher is typically composed of a variable capacitor or similar energy storage devices controlled by a motor or similar electrical component, making it challenging to control the matching element at high speeds. Hence, when the power level fluctuates in a period of several milliseconds, controlling the matching element of the matcher depending on fluctuations in the power levels becomes challenging. To address this challenge, in a certain case, upon being supplied with RF power having any one power level, the impedance of the load that includes the plasma being supplied with the RF power may be matched with the output impedance of the power supply. However, in such cases, when RF power of a different power level is supplied, the impedance of the load that includes plasma being supplied with the RF power will not match the output impedance of the power supply. This causes reflected power to increase, resulting in a decrease in the effective power supplied to the plasma. Effective power is determined as the difference between the forward (traveling) power and the reflected power on the transmission line. As a result, during processing using plasma, the plasma may become unstable and even be extinguished.

Accordingly, the present disclosure provides technology for enabling more stable maintenance of plasma during the processing using plasma.

First Embodiment

<Configuration of Plasma Processing System>

Figure 1:
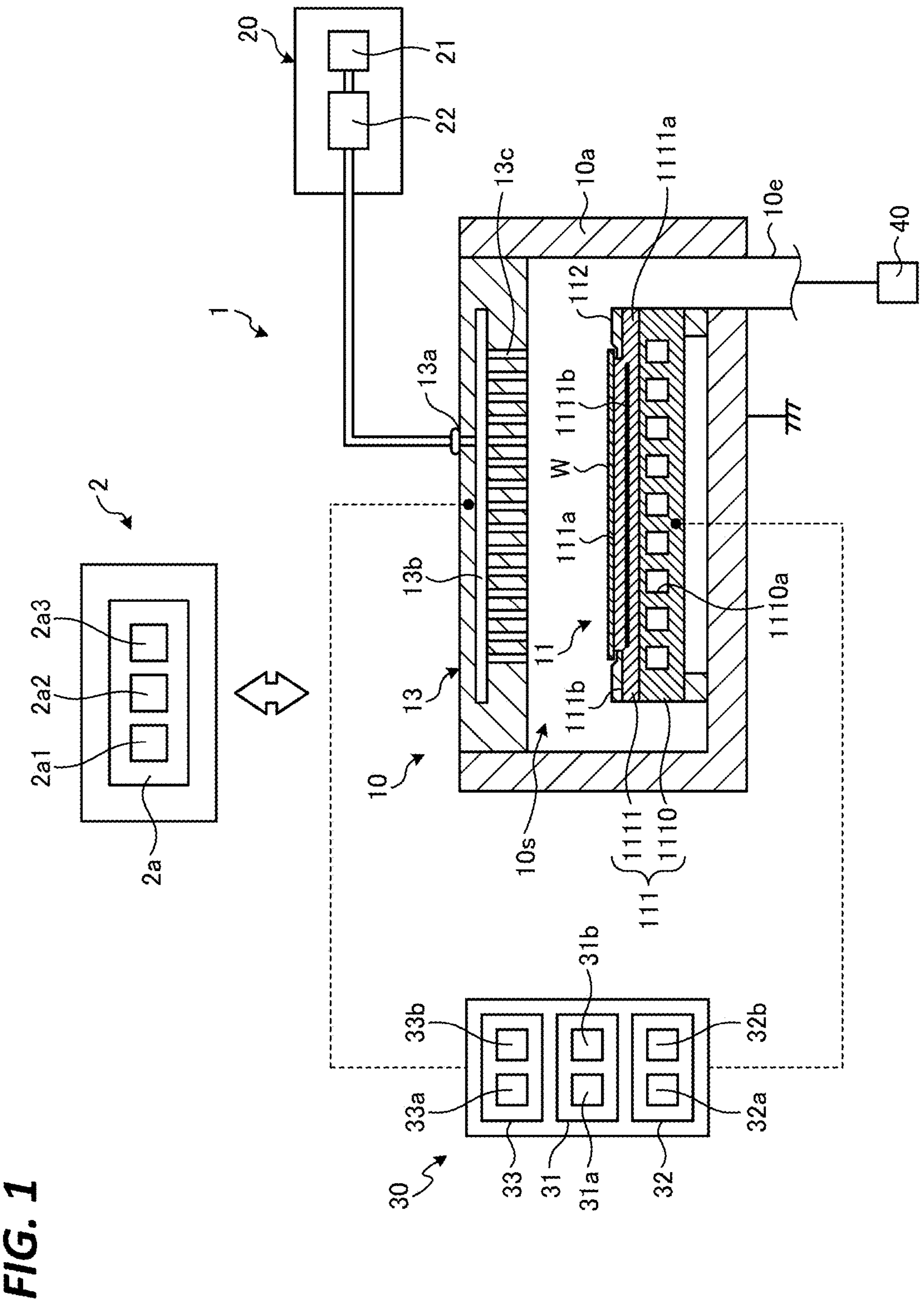
FIG. 1 is a schematic sectional view of an exemplary plasma processing system according to an embodiment of the present disclosure.

FIG. 1 is a schematic sectional view illustrating an exemplary plasma processing system according to one embodiment of the present disclosure.

The plasma processing system includes a capacitively coupled plasma processing apparatus 1 and a controller 2. The capacitively coupled plasma processing apparatus 1 includes a plasma processing chamber 10, a gas supply unit 20, a power source 30, and an exhaust system 40. Furthermore, the plasma processing apparatus 1 includes a substrate support 11 and a gas inlet. The gas inlet introduces at least one processing gas into the plasma processing chamber 10. The gas inlet includes a showerhead 13. The substrate support 11 is disposed in the plasma processing chamber 10. The showerhead 13 is disposed above the substrate support 11. In one specific embodiment, the showerhead 13 forms at least a portion of the ceiling of the plasma processing chamber 10. The plasma processing chamber 10 has a plasma processing space 10*s* that is defined by the showerhead 13, a side wall 10*a* of the plasma processing chamber 10, and the substrate support 11. The plasma processing chamber 10 also has at least one gas supply port for delivering at least one processing gas into the plasma processing space 10*s* and at least one gas discharge port for exhausting gas from the plasma processing space. The plasma processing chamber 10 is grounded, while the showerhead 13 and substrate support 11 are electrically insulated from the housing of the plasma processing chamber 10.

The substrate support 11 includes a body portion 111 and a ring assembly 112. The body portion 111 has a central region 111*a*, which supports a substrate W, and an annular region 111*b*, which supports the ring assembly 112. An example of the substrate W is a wafer. In a plan view, the annular region 111*b* of the body portion 111 encircles the central region 111*a* of the body portion 111. The substrate W is disposed on the central region 111*a* of the body portion 111. The ring assembly 112 is disposed on the annular region 111*b* of the body portion 111 to encircle the substrate W disposed on the central region 111*a* of the body portion 111. Thus, the central region 111*a* is also referred to as a substrate-supporting surface used for supporting the substrate W, while the annular region 111*b* is also referred to as a ring-support surface used for supporting the ring assembly 112.

In one embodiment, the body portion 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111*a* and an electrostatic electrode 1111*b* disposed in the ceramic member 1111*a*. The ceramic member 1111*a* has the central region 111*a*. In one specific embodiment, the ceramic member 1111*a* also has the annular region 111*b*. The annular region 111*b* may be included in another member that encircles the electrostatic chuck 1111, such as an annular electrostatic chuck or an annular insulating member. In this arrangement, the ring assembly 112 may be disposed on either the annular electrostatic chuck or the annular insulating member, or on both the electrostatic chuck 1111 and the annular insulating member. Furthermore, at least one RF-DC electrode coupled to a radio frequency (RF) power source 31 and/or a direct current (DC) power source 32, as described later, may be disposed inside the ceramic member 1111*a*. In this case, at least one RF-DC electrode functions as a lower electrode. When a bias RF signal and/or a DC signal, as described later, is applied to at least one RF-DC electrode, the RF-DC electrode is also called a bias electrode. The conductive member of the base 1110 and at least one RF-DC electrode may function as multiple lower electrodes. Alternatively, the electrostatic electrode 1111*b* may function as a lower electrode. Consequently, the substrate support 11 includes at least one lower electrode.

The ring assembly 112 includes one or more annular members. In a specific embodiment, one or more annular members have one or more edge rings and at least one cover ring. The edge ring is composed of a conductive or insulating material, while the cover ring is composed of an insulating material.

Further, the substrate support 11 may include a temperature regulation module, which adjusts the temperature of at least one of the electrostatic chuck 1111, the ring assembly 112, or the substrate to a target temperature. The temperature regulation module may include a heater, heat transfer medium, a flow path 1110*a*, or combinations thereof. Heat transfer fluids, like brine or gas, flow through the flow path 1110*a*. In one specific embodiment, the flow path 1110*a* is formed inside the base 1110, and one or more heaters are disposed in the ceramic member 1111*a* of the electrostatic chuck 1111. Furthermore, the substrate support 11 may also include a heat transfer gas supply unit that supplies a heat transfer gas to the gap between the back surface of the substrate W and the central region 111*a*.

The showerhead 13 introduces at least one processing gas from the gas supply unit 20 into the plasma processing space 10*s*. The showerhead 13 has at least one gas supply port 13*a*, at least one gas diffusion chamber 13*b*, and a plurality of gas introduction ports 13*c*. The processing gas supplied to the gas supply port 13*a* flows through the gas diffusion chamber 13*b* and enters the plasma processing space 10*s* via the multiple gas introduction ports 13*c*. Additionally, the showerhead 13 also includes at least one upper electrode. The gas inlet may include one or more side gas injectors (SGIs) attached to one or more openings formed in the side wall 10*a*, in addition to the showerhead 13.

The gas supply unit 20 may include at least one gas source 21 and at least one flow controller 22. In one specific embodiment, the gas supply unit 20 delivers at least one processing gas to the showerhead 13 from the corresponding gas sources 21 through the corresponding flow controllers 22. The flow controller 22 may include, for example, a mass flow controller or a pressure-controlled flow controller. Additionally, the gas supply unit 20 may include one or more flow modulation devices that modulate or pulse the flow rate of at least one processing gas.

The power source 30 includes an RF power source 31 that is coupled to the plasma processing chamber 10 via at least one impedance-matching circuit 33. The impedance-matching circuit 33 is electrically connected to the RF power source 31. The RF power source 31 supplies at least one RF signal (or RF power) to at least one lower electrode and/or at least one upper electrode. This configuration allows the production of plasma in the plasma processing space 10*s* by using at least one processing gas supplied to the plasma processing space 10*s*. Thus, the RF power source 31 may function as at least part of a plasma generator that produces plasma using one or more processing gases in the plasma processing chamber 10. Furthermore, when supplying a bias RF signal to at least one lower electrode, a bias potential may be generated in the substrate W, thereby drawing ion components in the produced plasma into the substrate W.

In one embodiment, the RF power source 31 includes a first RF generator 31*a* and a second RF generator 31*b*. The first RF generator 31*a* is exemplified by a first power supply, and the second RF generator 31*b* is an example of a second power supply. The first RF generator 31*a* is coupled to at least one lower electrode and/or at least one upper electrode via a first impedance-matching circuit 33*a* to generate a source RF signal (or source RF power) for plasma production. The source RF power is exemplified by a first RF power. The first impedance-matching circuit 33*a* is electrically connected to the first RF generator 31*a*. In one embodiment, the source RF signal has a frequency in the range of 10 MHz to 150 MHz. In one specific embodiment, the first RF generator 31*a* may generate multiple source RF signals with different frequencies. The generated one or more source RF signals are delivered to at least one lower electrode and/or at least one upper electrode.

The second RF generator 31*b* is coupled to at least one lower electrode via the second impedance-matching circuit 33*b* to generate the bias RF signal (bias RF power). The bias RF power is exemplified by a second RF power. The second impedance-matching circuit 33*b* is electrically connected to the second RF generator 31*b*. The frequency of the bias RF signal may be the same as or different from the frequency of the source RF signal. In one embodiment, the bias RF signal has a frequency lower than that of the source RF signal. In one specific embodiment, the bias RF signal has a frequency in the range of 100 kHz to 60 MHz. In one specific embodiment, the second RF generator 31*b* may generate multiple bias RF signals with different frequencies. The generated one or more bias RF signals are delivered to at least one lower electrode. Additionally, in some embodiments, at least one of the source RF signal or the bias RF signal may be pulsed.

Further, the power source 30 may include a direct current (DC) power source 32 coupled to the plasma processing chamber 10. The DC power source 32 includes a first DC generator 32*a* and a second DC generator 32*b*. In one embodiment, the first DC generator 32*a* is connected to at least one lower electrode to generate a first DC signal. The generated first bias DC signal is applied to at least one lower electrode. In one specific embodiment, the second DC generator 32*b* is connected to at least one upper electrode to generate a second DC signal. The generated second DC signal is applied to at least one upper electrode.

In various embodiments, at least one of the first or second DC signal may be pulsed, in which case a sequence of voltage pulses is applied to at least one lower electrode and/or at least one upper electrode. The voltage pulses may have pulse waveforms such as rectangular, trapezoidal, triangular, or combinations thereof. In one embodiment, a waveform generator, which generates a sequence of voltage pulses from the DC signal, may be connected between the first DC generator 32*a* and at least one lower electrode. Thus, the first DC generator 32*a* and the waveform generator constitute a voltage pulse generator. When the second DC generator 32*b* and the waveform generator constitute the voltage pulse generator, the voltage pulse generator may be connected to at least one upper electrode. The voltage pulse may have either a positive or negative polarity. Additionally, the sequence of voltage pulses may include one or more positive voltage pulses and one or more negative voltage pulses in one period. The first and second DC generators 32*a* and 32*b* may be provided, in addition to the RF power source 31. Furthermore, the first DC generator 32*a* may be provided as a substitute for the second RF generator 31*b*.

The exhaust system 40 may be connected to, for example, a gas discharge port that is provided at the bottom of the plasma processing chamber 10. The exhaust system 40 may include a pressure regulating valve and a vacuum pump. The pressure regulating valve controls the pressure in the plasma processing space 10*s*. The vacuum pumps may include turbomolecular pumps, dry pumps, or combinations thereof.

The controller 2 processes computer-executable instructions, which cause the plasma processing apparatus 1 to perform the various processing described herein. The controller 2 is capable of controlling every component of the plasma processing apparatus 1, enabling the components to perform various processing described herein. In one specific embodiment, the entirety or a part of the controller 2 may be incorporated into the plasma processing apparatus 1. The controller 2 may include a processor 2*a*1, a storage unit 2*a*2, and a communication interface 2*a*3. The controller 2 is implemented by, for example, a computer 2*a*. The processor 2*a*1 is capable of reading and executing a program from the storage unit 2*a*2, enabling the performance of various control operations. The program may be pre-stored in the storage unit 2*a*2 or retrieved from a medium as needed. Once retrieved, the program is stored in the storage unit 2*a*2 and then loaded from the storage unit 2*a*2 by the processor 2*a*1 for execution. Examples of the medium include various storage media that are readable by the computer 2*a* and a communication line connected to the communication interface 2*a*3. The processor 2*a*1 may be a central processing unit (CPU). The storage unit 2*a*2 may include random-access memory (RAM), read-only memory (ROM), hard disk drive (HDD), solid-state drive (SSD), or a combination thereof. The communication interface 2*a*3 may facilitate communication with the plasma processing apparatus 1 over a communication line such as a local area network (LAN).

[Configuration of First RF Generator 31*a* and First Impedance-Matching Circuit 33*a*]

Figure 2:
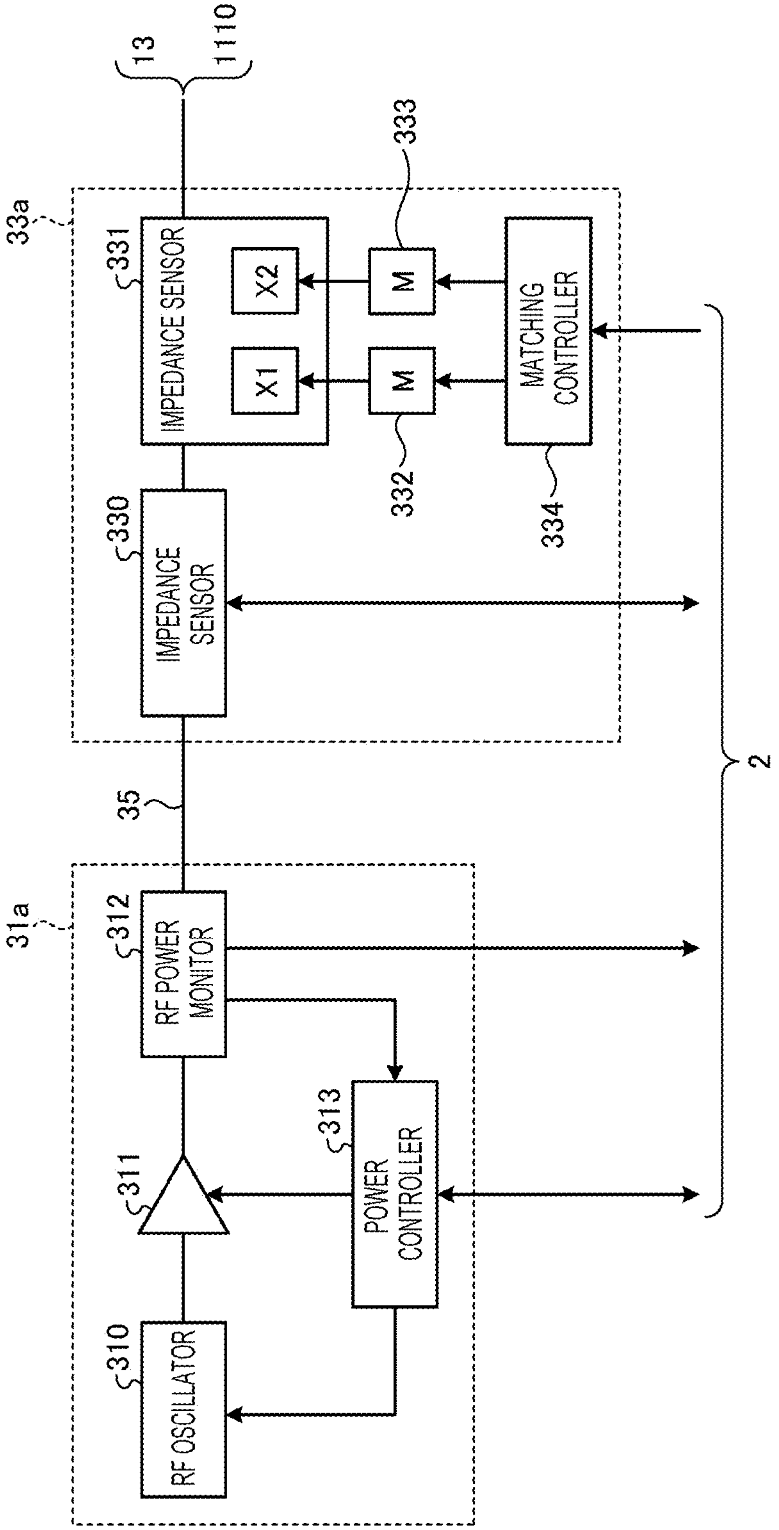
FIG. 2 is a block diagram illustrating an exemplary first RF generator and an exemplary first impedance-matching circuit.

FIG. 2 is a block diagram illustrating an example of the first RF generator 31*a* and the first impedance-matching circuit 33*a*. In FIG. 2, exemplary configurations of the first RF generator 31*a* and the first impedance-matching circuit 33*a* are illustrated, but the configurations of the second RF generator 31*b* and the second impedance-matching circuit 33*b* are similar to those illustrated in FIG. 2.

The first RF generator 31*a* has an RF oscillator 310, an amplifier 311, an RF power monitor 312, and a power controller 313. The RF oscillator 310 generates a first RF power with a waveform, such as a sinusoidal waveform. The amplifier 311 amplifies the first power output from the RF oscillator 310 with an adjustable gain or amplification factor.

The RF power monitor 312 includes a directional coupler, a forward power monitoring unit, and a reflected power monitoring unit. The directional coupler extracts signals corresponding to forward power PF that propagates in the forward direction (from the first RF generator 31*a* to the first impedance-matching circuit 33*a*) and reflected power PR that propagates in the reverse direction over a transmission line 35. The forward power monitoring unit generates a measurement signal that indicates the power level of the forward power PF extracted by the directional coupler. The generated measurement signal is output to both the power controller 313 and the controller 2. The reflected power monitoring unit generates a measurement signal that indicates the power level of the reflected power PR returning from the plasma within the plasma processing chamber 10 to the first RF generator 31*a*. The generated measurement signal is output to both the power controller 313 and the controller 2.

The power controller 313 controls the RF oscillator 310 and the amplifier 311 based on both a control signal output from the controller 2 and a measurement value signal output from the RF power monitor 312. The control signal output from the controller 2 includes a signal specifying the power level of the first RF power and a signal providing instructions for the supply and cutoff of the first RF power.

The first impedance-matching circuit 33*a* has an impedance sensor 330, a matching circuit 331, an actuator 332, an actuator 333, and a matching controller 334. The impedance sensor 330 measures the impedance of the load, including the impedance of the matching circuit 331 over the transmission line 35 during the period specified by the controller 2. The measured result is then outputted to the controller 2. The matching circuit 331 includes a plurality of controllable reactance elements X1 and X2. The reactance elements X1 and X2 are exemplified by a matching element.

The actuator 332 is, for example, a motor or similar electrical component and adjusts the reactance value of the reactance element X1 in the matching circuit 331 based on the control signal from the matching controller 334. The actuator 333 is, for example, a motor or similar electrical component and adjusts the reactance value of the reactance element X2 in the matching circuit 331 based on the control signal from the matching controller 334. The matching controller 334 calculates the reactance values of the reactance elements X1 and X2 to achieve impedance matching between a target impedance $Z_T$ specified by the controller 2 and the output impedance of the first RF generator 31*a* during the period specified by the controller 2. The matching controller 334 then outputs a control signal, which is used to specify an intended control amount corresponding to the calculated reactance value, to the actuator 332 and the actuator 333.

[First RF Power and Second RF Power]

Figure 3:
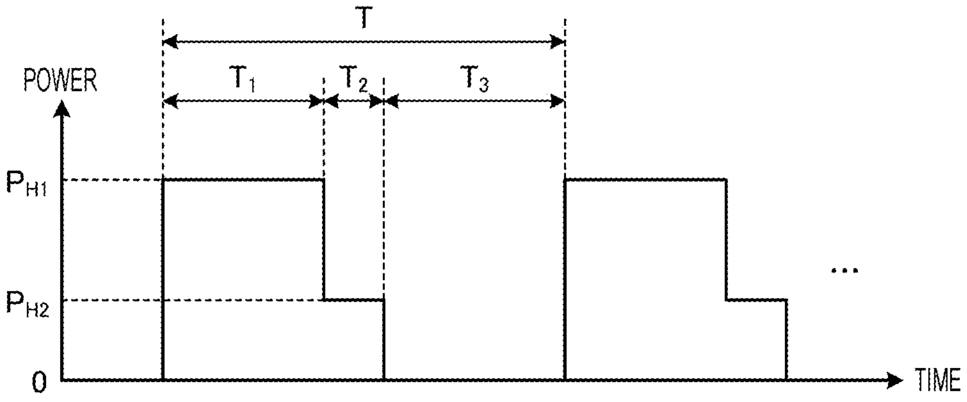
FIG. 3 is a diagram illustrating an example of fluctuations over time in the power level of first RF power.
Figure 4:
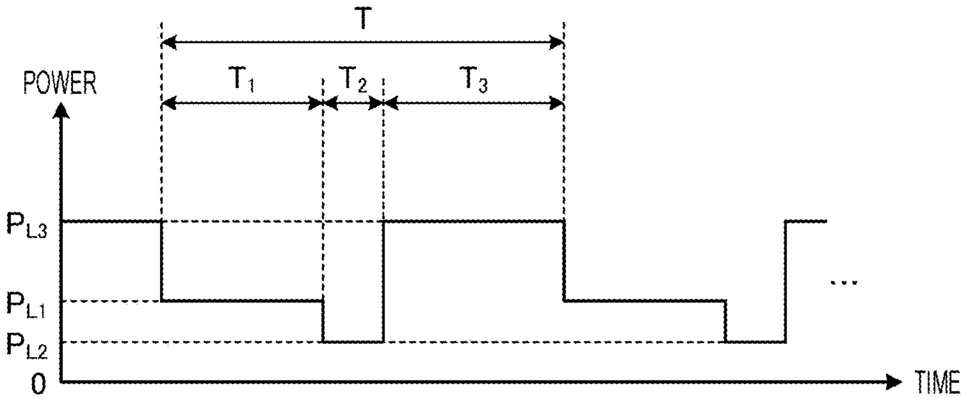
FIG. 4 is a diagram illustrating an example of fluctuations over time in the power level of second RF power.

FIG. 3 illustrates an example of fluctuations over time in the power levels of the first RF power, and FIG. 4 illustrates an example of fluctuations over time in the power levels of the second RF power. FIGS. 3 and 4 illustrate an example of temporal fluctuations in an effective power PL supplied to a load that includes plasma.

In the present embodiment, the first RF generator 31*a* supplies the first RF power to at least one of the base 1110 or the showerhead 13 through the first impedance-matching circuit 33*a*. The first RF power follows a repeating pattern with a period T, for example, as illustrated in FIG. 3. Similarly, in the present embodiment, the second RF generator 31*b* supplies the second RF power to at least one of the base 1110 or the bias electrodes disposed in the electrostatic chuck 1111 through the second impedance-matching circuit 33*b*. The second RF power also follows a repeating pattern with the period T, for example, as illustrated in FIG. 4. In the present embodiment, the period T is several milliseconds in duration.

The period T includes first, second, and third time intervals $T_1$, $T_2$, and $T_3$. In the example illustrated in FIGS. 3 and 4, the first time interval $T_1$ is greater than the second time interval $T_2$, and the third time interval $T_3$ is greater than both the first time interval $T_1$ and the second time interval $T_2$. Specifically in the examples illustrated in FIGS. 3 and 4, among the first to third time intervals $T_1$ to $T_3$, the second time interval $T_2$ is the shortest, and the third time interval $T_3$ is the longest. The relationship between the lengths of the first time interval $T_1$, the second time interval $T_2$, and the third time interval $T_3$ is not limited to the specific relationships illustrated in FIGS. 3 and 4.

In one example, as illustrated in FIG. 3, the first RF generator 31*a* supplies the first RF power of a power level $P_{H1}$ during the first time interval $T_1$, supplies the first RF power of a power level $P_{H2}$ during the second time interval $T_2$, and stops supplying the first RF power during the third time interval $T_3$. It may also be considered that during the third time interval $T_3$, the first RF power having a power level of zero (0) is supplied. In the example illustrated in FIG. 3, the power level $P_{H1}$ is higher than the power level $P_{H2}$. The relationship between the magnitudes of the first RF power supplied over each of the first, second, and third time intervals $T_1$, $T_2$, and $T_3$ is not restricted to the specific relationship illustrated in FIG. 3.

In one example, as illustrated in FIG. 4, the second RF generator 31*b* supplies the second RF power of a power level $P_{L1}$ during the first time interval $T_1$, the second RF power of a power level $P_{L2}$ during the second time interval $T_2$, and the second RF of a power level $P_{L3}$ during the third time interval $T_3$. In the example illustrated in FIG. 4, among the power levels $P_{L1}$ to $P_{L3}$, the power level $P_{L3}$ is the highest power level, and the power level $P_{L2}$ is the lowest. The relationship between the magnitudes of the second RF power supplied over each of the first, second, and third time intervals $T_1$, $T_2$, and $T_3$ is not restricted to the specific relationship illustrated in FIG. 4.

<Forward Power PF and Reflected Power PR in Comparative Example>

Figure 5:
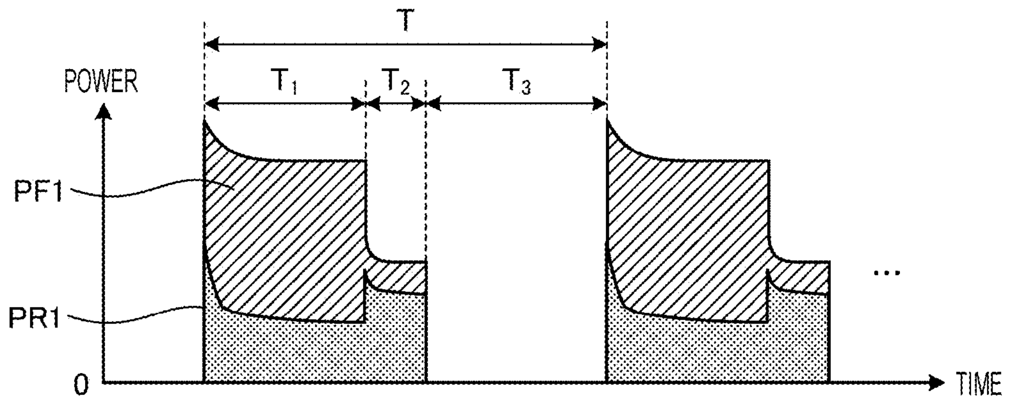
FIG. 5 is a diagram illustrating an example of forward power and reflected power for the first RF power as a comparative example.
Figure 6:
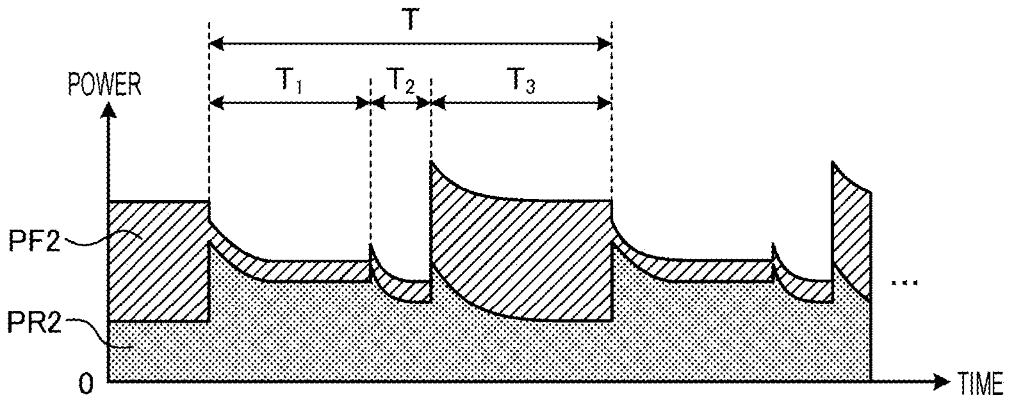
FIG. 6 is a diagram illustrating an example of forward power and reflected power for the second RF power as a comparative example.

FIG. 5 is a diagram illustrating an example of a first forward power PF1 and a first reflected power PR1 for the first RF power as a comparative example. FIG. 6 is a diagram illustrating an example of a second forward power PF2 and a second reflected power PR2 for the second RF power as a comparative example.

In one example, as illustrated in FIG. 5, the first forward power PF1 of the first RF power, which is supplied from the first RF generator 31*a*, is delivered to a load that includes plasma. Then, a portion of this power is reflected back to the first RF generator 31*a*, forming the reflected power PR1. The difference between the first forward power PF1 and the first reflected power PR1 is a first effective power PL1 to be supplied to the load.

Similarly, in one example, as illustrated in FIG. 6, the second forward power PF2 of the second RF power supplied from the second RF generator 31*b* is delivered to a load that includes plasma. Then, a portion of this power is reflected back to the second RF generator 31*b*, forming the second reflected power PR2. The difference between the second forward power PF2 and the second reflected power PR2 is a second effective power PL2 to be supplied to the load.

In this regard, the reactance elements X1 and X2 in each of the first impedance-matching circuit 33*a* and the second impedance-matching circuit 33*b* are controlled by the actuators 332 and 333 such as a motor. For this reason, achieving high-speed control of the reactance values of the reactance elements X1 and X2 at a period of several milliseconds is challenging. Due to this limitation, it becomes challenging to adjust the reactance values of the reactance elements X1 and X2, conforming to the condition of the load during each of the first to third time intervals $T_1$ to $T_3$ included in the period T.

Thus, the reactance values of the reactance elements X1 and X2 are adjusted to align with the load impedance measured at the specific timing, ensuring that the output impedance of the RF power source 31 matches the load impedance. Once adjusted, these reactance values are maintained for a certain duration.

In one example, for the first RF power, the reactance values of the reactance elements X1 and X2 are adjusted to ensure that the output impedance of the first RF generator 31*a* matches the impedance of the load in the first time interval $T_1$ in which the first effective power PL1 is the largest during the period T. Furthermore, in one example, for the second RF power, the reactance values of reactance elements X1 and X2 are adjusted to ensure that the output impedance of the second RF generator 31*b* matches the impedance of the load in the third time interval $T_3$ in which the second effective power PL2 is the largest during the period T.

Figure 7:
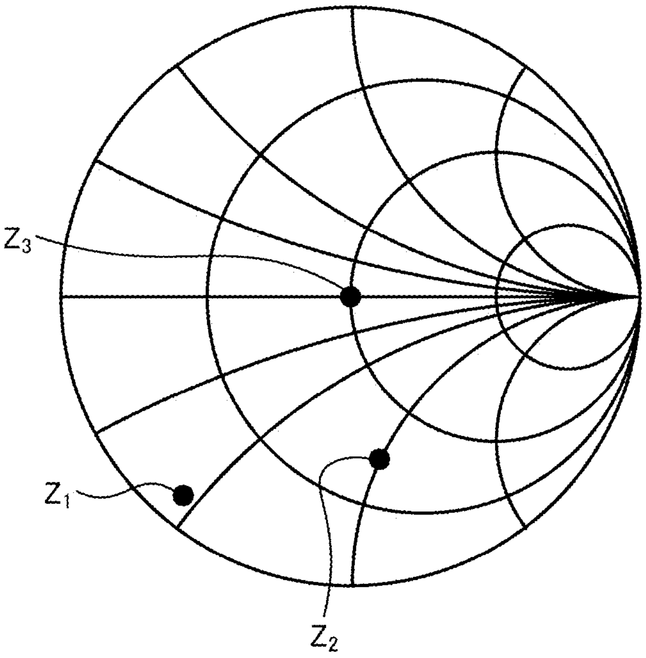
FIG. 7 is a Smith chart illustrating an example of the distribution of load impedance in each time interval as a comparative example.

FIG. 7 is a diagram illustrating an example of the impedance distribution of a load in each time interval in the comparative example. In FIG. 7, the load impedance including the impedance of the matching circuit 331 is illustrated for the second RF power. In FIG. 7, "$Z_1$" represents the load impedance in the first time interval $T_1$, which includes the impedance of the matching circuit 331. Additionally, in FIG. 7, "$Z_2$" represents the load impedance in the second time interval $T_2$, which includes the impedance of the matching circuit 331. Furthermore, in FIG. 7, "$Z_3$" represents the load impedance in the third time interval $T_3$, which includes the impedance of the matching circuit 331. In the comparative example, the load impedance $Z_3$ in the third time interval $T_3$ is adjusted to match the output impedance (e.g., 50Ω) of the second RF generator 31*b*.

However, the adjustment of the reactance value during a specific time interval included in the period T results in an increase in the reflected power PR2. This is attributed to the mismatch between the output impedance of the second RF generator 31*b* and the impedance of the load during other time intervals within the period T. In one example, in FIG. 7, both the load impedance $Z_1$ during the first time interval $T_1$ and the load impedance $Z_2$ during the second time interval $T_2$ are significantly misaligned from the output impedance of the second RF generator 31*b*.

Further, at the boundaries of the time intervals, the magnitudes of the first forward power PF1 supplied from the first RF generator 31*a* and the second forward power PF2 supplied from the second RF generator 31*b* change. This is to change the first effective power PL1 and the second effective power PL2 to be supplied to the load. This change transiently alters the condition of plasma, leading to a transient change in the impedance of plasma. Accordingly, in one specific example, as illustrated in FIGS. 5 and 6, the first reflected power PR1 and the second reflected power PR2 are even greater at the boundaries between time intervals. These significant fluctuations in the first reflected power PR1 and the second reflected power PR2 intensify the fluctuations in the first effective power PL1 and the second effective power PL2 supplied to the plasma, making the plasma condition unstable. Such an unstable plasma condition may cause the plasma to be extinguished. When the plasma is extinguished, the plasma-based process fails to proceed.

Thus, in the present embodiment, a target impedance $Z_T$ is calculated based on the load impedances $Z_1$ to $Z_3$ across the respective time intervals included in the period T. Subsequently, the reactance values of the reactance elements X1 and X2 are adjusted to match the calculated target impedance $Z_T$ with the output impedance of the RF power source 31. In the present embodiment, the target impedance $Z_T$ is calculated using a weighted average obtained by assigning a weight to each of the load impedances $Z_1$ to $Z_3$.

In the present embodiment, the weight $w_i$ for the impedance $Z_i$ of the load during the i-th time interval included in the period T is calculated using, for example, Formula (1) below:

$$w_i = \frac{PL_i}{\sum_{k=1}^{n} PL_k} \tag{1}$$

where $PL_i$ represents the magnitude of the effective power PL supplied to the load during the i-th time interval, and n represents the total number of time intervals included in the period T. As evident from Formula (1), a higher weight $w_i$ is assigned to the impedance $Z_i$ of the load, which corresponds to the time interval in which the effective power PL supplied to the load is greater.

Then, the target impedance $Z_T$ is calculated using, for example, Formula (2) below:

$$Z_T = \sum_{i=1}^{n} w_i Z_i \tag{2}$$

Figure 8:
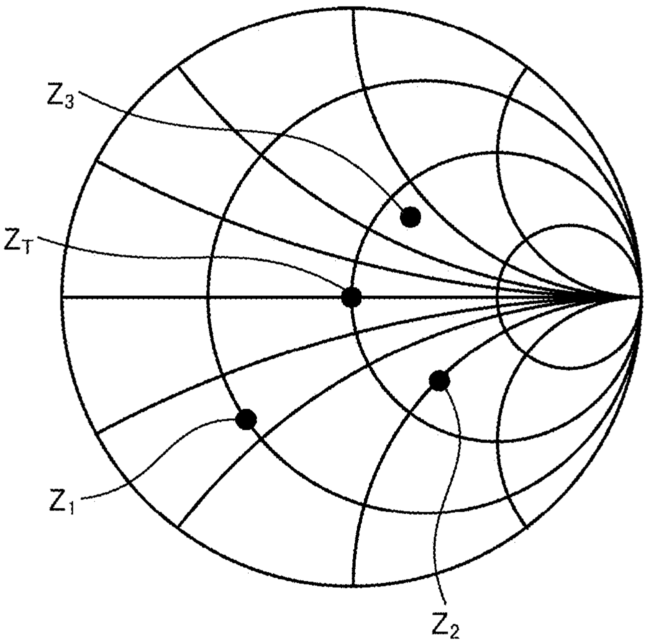
FIG. 8 is a Smith chart illustrating an example of the distribution of load impedance in each time interval according to the present embodiment.

The target impedance $Z_T$ may be determined, for example, by calculating the total value of the product of the weight $w_i$ and the load impedance $Z_i$ in each time interval, as expressed in Formula (2) above. Consequently, the impedance of the load in each time interval is adjusted, resulting in the adjusted impedance values as illustrated, for example, in FIG. 8. FIG. 8 is a diagram illustrating an example of the distribution of the impedance $Z_i$ of the load in each time interval according to the present embodiment. In the present embodiment, the reactance values of the reactance elements X1 and X2 are adjusted to match the target impedance $Z_T$ with the output impedance of the RF power source 31, for example, as illustrated in FIG. 8. This adjustment enables a reduction of the difference in the magnitude of the reflection coefficients of the load impedances $Z_1$ to $Z_3$ in each time interval.

Figure 9:
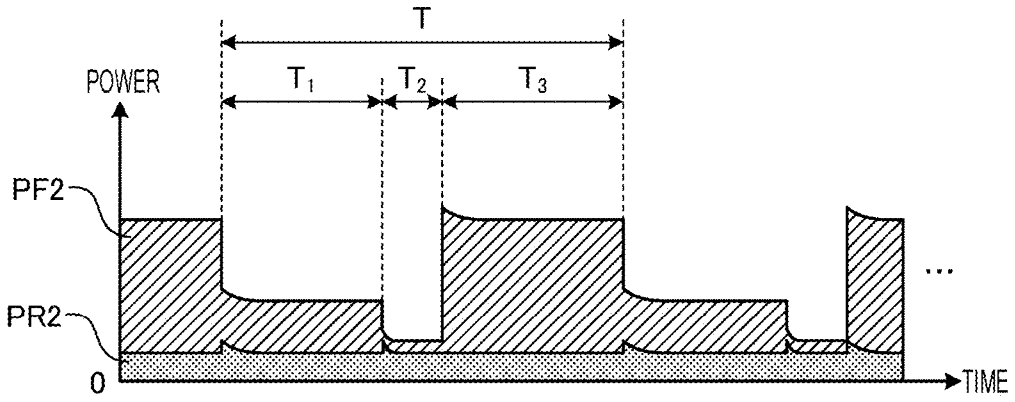
FIG. 9 is a diagram illustrating an example of forward power and reflected power for the second RF power according to the present embodiment.

FIG. 9 is a diagram illustrating an example of the second forward power PF2 and the second reflected power PR2 for the second RF power according to the present embodiment. In one example, as illustrated in FIG. 9, the difference between the second reflected powers PR2 in the respective time intervals included in the period T is small. Accordingly, it is possible to reduce the fluctuations in plasma in each time interval included in the period T, achieving stable maintenance of plasma.

Figure 10:
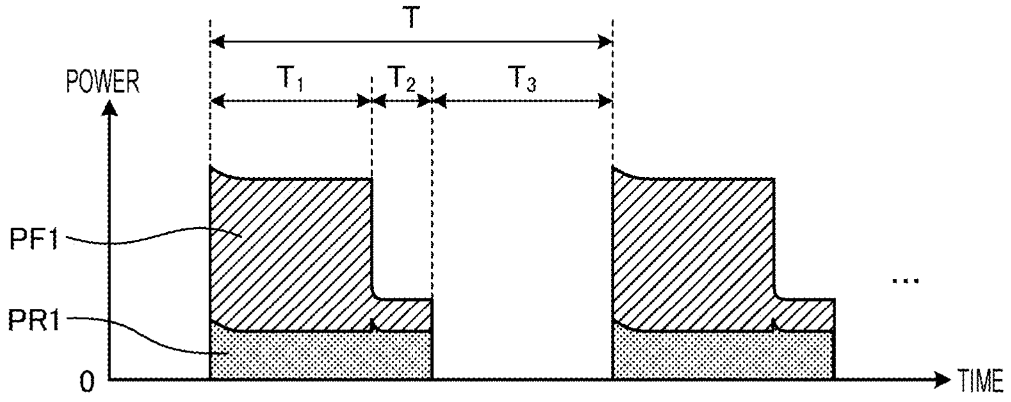
FIG. 10 is a diagram illustrating an example of forward power and reflected power for the first RF power according to the present embodiment.

Also for the first RF power, the target impedance ZT is calculated using Formulas (1) and (2) above in each time interval other than the time interval during which the supply of the first RF power is interrupted. Subsequently, the reactance values of the reactance elements X1 and X2 are adjusted to match the calculated target impedance $Z_T$ with the output impedance of the first RF generator 31*a*. As a result, in one example, as illustrated in FIG. 10, the difference between the first reflected powers PR1 in the respective time intervals included in the period T may be reduced. Accordingly, it is possible to achieve stable maintenance of the plasma in each time interval included in the period T even for the first RF power.

<Plasma Processing Method>

Figure 11:
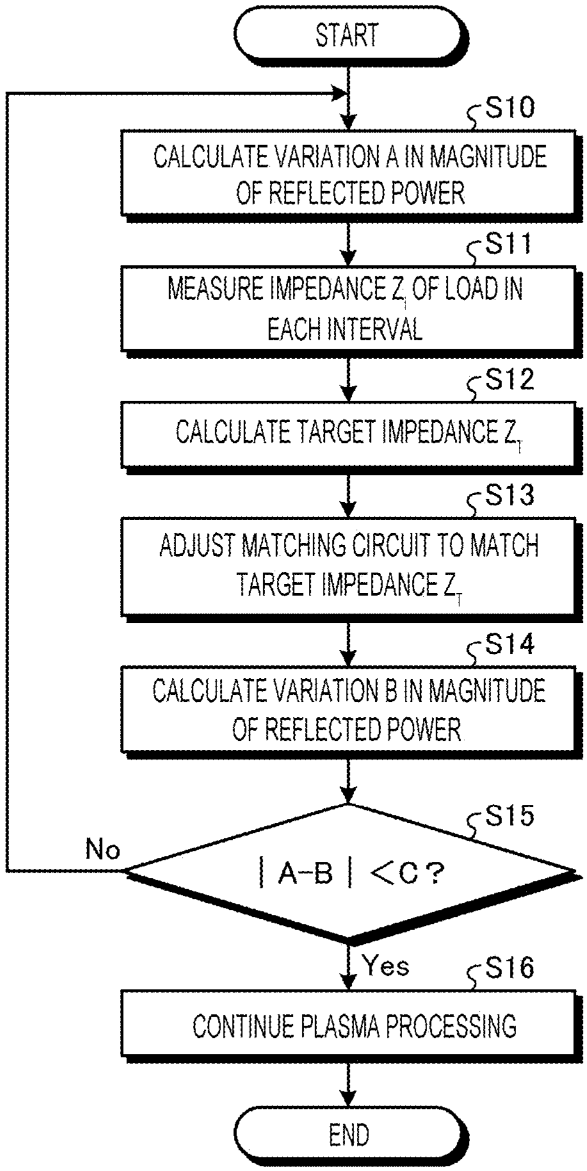
FIG. 11 is a flowchart illustrating an exemplary plasma processing method.

FIG. 11 is a flowchart illustrating an exemplary plasma processing method. The controller 2 controls every component of the plasma processing apparatus 1, implementing the processing illustrated in FIG. 11. Further, the processing illustrated in FIG. 11 is performed at the initial stage of the plasma processing. Additionally, the processing illustrated in FIG. 11 is performed when the plasma processing begins for an unprocessed substrate W, when the plasma processing begins under different processing conditions, or in similar situations.

The reactance values of the reactance elements X1 and X2 in the matching circuit 331 are set to the predetermined initial values before initiating the processing illustrated in FIG. 11. Additionally, in FIG. 11, the second RF power that is periodically controlled to three different power levels is exemplified for description, but similar processing may be applied for the first RF power that is periodically controlled to two different power levels.

First, the controller 2 calculates a variation A in the magnitude of the second reflected power PR2 over respective time intervals included in the period T (S10). Step S10 is exemplified by first processing and process step (c). During step S10, the magnitude of a second reflected power PR$2_i$ in each time interval included in the period T is measured. The second reflected power PR$2_i$ represents the magnitude of the second reflected power PR2 in the i-th time interval. The magnitude of the second reflected power PR$2_i$ in each time interval undergoes significant transient variations near the boundaries of the time intervals, for example, as illustrated in FIG. 6. Thus, it is preferable for the controller 2 to measure the magnitude of the second reflected power PR$2_i$ in each time interval after the change in the magnitude of the second reflected power PR$2_i$ stabilizes (e.g., in the latter portion of the time interval).

Then, the controller 2 calculates the variation A in the magnitude of the second reflected power PR2 based on the measured magnitude of the second reflected power PR$2_i$ in each time interval. In the present embodiment, the variation A in the magnitude of the second reflected power PR2 is, for example, the standard deviation σ of the magnitude of the second reflected power PR$2_i$ in each time interval. The calculation of the standard deviation σ is performed, for example, using Formulas (3) and (4) below:

$$\sigma = \sqrt{\frac{1}{n}\sum_{i=1}^{n}(PR2_i - PR2_{ave})^2} \tag{3}$$

$$PR2_{ave} = \frac{\sum_{i=1}^{n} PR2_i}{n} \tag{4}$$

Subsequently, the controller 2 controls the impedance sensor 330 to cause the impedance sensor 330 to measure the impedance $Z_i$ of the load in each time interval (S11). Step S11 is exemplified by process step (a). The second effective power PL2 exhibits fluctuations near the boundaries of the time intervals, leading to significant transient alterations in the plasma condition. Consequently, this increases the change in the impedance $Z_i$ of the load in each time interval, particularly near the boundaries between time intervals. Thus, it is preferable for the controller 2 to instruct the impedance sensor 330 to measure the impedance $Z_i$ of the load in each time interval once the plasma condition stabilizes (e.g., in the latter portion of the time interval).

Subsequently, the controller 2 calculates the target impedance $Z_T$ (S12). In step S12, the weight $w_i$ of each time interval is calculated, for example, using Formula (1) above, and the target impedance $Z_T$ is calculated, for example, using Formula (2) above.

Subsequently, the controller 2 adjusts the matching element to match the target impedance $Z_T$ with the output impedance of the second RF generator 31*b* (S13). Step S13 is exemplified by process step (b). In step S13, the actuators 332 and 333 are controlled to adjust the reactance values of the reactance elements X1 and X2 in the matching circuit 331, ensuring that the target impedance ZT matches the output impedance of the second RF generator 31*b*.

After adjusting the matching element, the controller 2 recalculates a variation B in the magnitude of the second reflected power PR2 over respective time intervals included in the period T (S14). In step S14, the variation B in the magnitude of the second reflected power PR2 over respective time intervals included in the period T is calculated using a method similar to that employed in step S10. Step S14 is exemplified by second processing and process step (d).

Subsequently, the controller 2 determines whether a difference between the variation A calculated in step S10 and the variation B calculated in step S14 is less than a predetermined value C (S15). In one example, the predetermined value C may be set to 1.0. Additionally, step S15 is exemplified by third processing and process step (e).

When the difference between the variation A and the variation B is equal to or greater than the predetermined value C (S15: No), the processing in step S10 is performed again. Otherwise, when the difference between the variation A and the variation B is less than the predetermined value C (S15: Yes), the plasma processing continues (S16). Then, the plasma processing method illustrated in this flowchart ends upon completion of the plasma processing.

In the above, the embodiments have been described. As mentioned earlier, the plasma processing system according to the present embodiment is provided with the plasma processing chamber 10, the substrate support 11, the impedance-matching circuit 33, the RF power source 31, and the controller 2. The substrate support 11 is disposed in the plasma processing chamber 10. The impedance-matching circuit 33 is electrically connected to the substrate support 11. The RF power source 31 is electrically connected to the impedance-matching circuit 33 and generates the periodic RF pulse that includes the first, second, and third power levels. The controller 2 calculates the impedance $Z_i$ of the load based on the reflected power PR of the RF pulse in each of the first time interval during which the first power level is supplied, the second time interval during which the second power level is supplied, and the third time interval during which the third power level is supplied. The controller 2 also controls the matching element included in the impedance-matching circuit 33 based on the impedance $Z_i$ of the load calculated over the respective first, second, and third time intervals. These configurations enable the achievement of more stable maintenance of plasma in the processing using plasma.

Further, in the embodiment described above, the controller 2 calculates a first weight $w_1$ based on the first power level, a second weight $w_2$ based on the second power level, and a third weight $w_3$ based on the third power level. The controller 2 also calculates a total value of a product of a first load impedance $Z_1$ and the first weight $W_1$ in the first time interval $T_1$, a product of a second load impedance $Z_2$ and the second weight $W_2$ in the second time interval $T_2$, and a product of a third load impedance $Z_3$ and the third weight $W_3$ in the third time interval $T_3$. The controller 2 then controls the matching element included in the impedance-matching circuit 33 to match the total value with the output impedance of the RF power source 31. These configurations enable the reduction in the difference of the reflected power PF in each time interval.

Further, in the embodiment described above, the first weight $w_1$ is determined by the first power level relative to a total value of the first power level, the second power level, and the third power level. The second weight $w_2$ is determined by the second power level relative to a total value of the first power level, the second power level, and the third power level. The third weight $w_3$ is determined by the third power level relative to a total value of the first power level, the second power level, and the third power level. These configurations enable the reduction of unnecessary power consumption by decreasing the reflected power PR, as the higher the power level supplied to the load, the smaller the reflected power PR.

Further, in the embodiment described above, the controller 2 performs first processing, second processing, and third processing. The first processing calculates the variation A of the reflected power PR over each of the first time interval $T_1$, the second time interval $T_2$, and the third time interval $T_3$. The second processing recalculates the variation B in the reflected power PR over each of the first time interval $T_1$, the second time interval $T_2$, and the third time interval $T_3$, following controlling the matching element included in the impedance-matching circuit based on the first load impedance $Z_1$, the second load impedance $Z_2$, and the third load impedance $Z_3$. The third processing repeats the first processing and the second processing in sequential order until the difference between the variation A of the reflected power PR calculated in the first processing and the variation B in the reflected power PR calculated in the second processing is less than the predetermined value C. These configurations enable the reduction of the difference in the reflected power PF in each time interval.

Further, in the embodiment described above, the variation is the standard deviation of values of the reflected power PR over each of the first time interval $T_1$, the second time interval $T_2$, and the third time interval $T_3$. This configuration enables the precise evaluation of the variation in the values of the reflected power PR over a plurality of time intervals.

Further, in the embodiment described above, the RF power source 31 has the first RF generator 31*a* that supplies the first RF power for plasma production and the second RF generator 31*b* that supplies the second RF power for bias having a frequency lower than that of the first RF power. Additionally, the impedance-matching circuit 33 has the first impedance-matching circuit 33*a* electrically connected to the first RF generator 31*a* and the second impedance-matching circuit 33*b* electrically connected to the second RF generator 31*b*. At least one of the first RF generator 31*a* or the second RF generator 31*b* generates the periodic RF pulse that includes the first power level, the second power level, and the third power level.

Moreover, the embodiment described above further includes the showerhead 13 that has an electrode and supplies gas into the plasma processing chamber 10. Additionally, the substrate support 11 has an electrode. The first RF generator 31*a* supplies the first RF power to at least one of the electrode of the showerhead 13 or the electrode of the substrate support 11. Furthermore, the second RF generator 31*b* supplies the second RF power to at least one of the base 1110 of the substrate support 11 or the electrode in the electrostatic chuck 1111 of the substrate support 11.

Further, the plasma processing method according to the embodiment described above is executed in the plasma processing system. The plasma processing method includes process steps (a) and (b). The plasma processing system includes the plasma processing chamber 10, the substrate support 11, the impedance-matching circuit 33, the RF power source 31, and the controller 2. The substrate support 11 is disposed in the plasma processing chamber 10. The impedance-matching circuit 33 is electrically connected to the substrate support 11. The RF power source 31 is electrically connected to the impedance-matching circuit 33 and generates the periodic RF pulse that includes the first power level, the second power level, and the third power level. In process step (a), the controller 2 calculates the impedance $Z_i$ of the load based on the reflected power PR of the RF pulse in each of the first time interval $T_1$ during which the first power level is supplied, the second time interval $T_2$ during which the second power level is supplied, and the third time interval $T_3$ during which the third power level is supplied. Additionally, in process step (b), the controller 2 controls the matching element included in the impedance-matching circuit 33 based on the impedance $Z_i$ of the load calculated in each of the first time interval $T_1$, the second time interval $T_2$, and the third time interval $T_3$. These configurations enable the achievement of more stable maintenance of plasma in the processing using plasma.

Further, in process step (b) described in the embodiment described above, the first weight $w_1$ based on the first power level, the second weight $w_2$ based on the second power level, and the third weight $w_3$ based on the third power level are calculated. The total value of the product of the first load impedance $Z_1$ and the first weight $W_1$ in the first time interval $T_1$, the product of the second load impedance $Z_2$ and the second weight $W_2$ in the second time interval $T_2$, and the product of the third load impedance $Z_3$ and the third weight $W_3$ in the third time interval $T_3$ is calculated. Then, the matching element included in the impedance-matching circuit 33 is controlled to match the total value with an output impedance of the RF power source 31. These configurations enable the reduction of the difference in the reflected power PF in each time interval.

Further, the plasma processing method according to the embodiment described above includes process steps (c), (d), and (e). In process step (c), the variation A of the reflected power PR over each of the first time interval $T_1$, the second time interval $T_2$, and the third time interval $T_3$ is calculated, before performing process steps (a) and (b). In process step (d), the variation B of the reflected power PR is recalculated over each of the first time interval $T_1$, the second time interval $T_2$, and the third time interval $T_3$. After performing process steps (a) and (b). In process step (e), process steps (c), (a), (b), and (d) are performed in this sequential order until the difference between the variation A of the reflected power PR calculated in process (c) and the variation B of the reflected power PR calculated in process step (d) is less than the predetermined value C. These configurations enable the reduction of the difference in the reflected power PF in each time interval.

<Additional Remarks>

The technology disclosed herein is not restricted to the embodiments described above, and it allows for various modifications within the scope of its essence.

In one example, in the embodiment described above, the weight $w_i$ for the impedance $Z_i$ of the load in each time interval included in the period T is calculated based on Formula (1) above, but the disclosed technology is not limited to this exemplary embodiment. In one example, the weight $w_i$ for the impedance $Z_i$ of the load in each time interval may be calculated as $w_i=1/m$, where m represents the total number of time intervals included in the period T. In one example, in the case of the second power illustrated in FIG. 4, the weights $w_i$ assigned to the load impedances $Z_i$ in the respective time intervals are uniformly set to ⅓.

Further, in the embodiment described above, at least one of the first RF power or the second RF power may periodically vary among three different power levels, but the disclosed technology is not restricted to this exemplary embodiment. At least one of the first RF power or the second RF power may periodically vary among four or more different power levels. Additionally, at least one of the first RF power or the second RF power may periodically vary between two different power levels.

Further, in the embodiment described above, the standard deviation of the magnitude of the reflected power PR in each time interval included in the period T is calculated as an illustrative example of variations, but the disclosed technology is not restricted to this exemplary embodiment. Alternatively, the variation in the magnitude of the reflected power PR over respective time intervals included in the period T may also be represented by dispersion or a range that is the difference between the maximum and minimum values.

Further, in the embodiment described above, plasma processing may encompass various processes such as etching, film deposition, modification, cleaning, or other similar processes, as long as they involve the use of plasma to process the substrate W.

Further, in the embodiment described above, the capacitively coupled plasma (CCP) is exemplified as the plasma source, but the disclosed technology is not restricted to this exemplary embodiment. Alternative plasma sources, such as microwave plasma, inductively coupled plasma (ICP), or similar options, may also be used.

Further, the following appendixes are disclosed in addition to the embodiments described above.

APPENDIX 1

A plasma processing system including:

a plasma processing chamber;

a substrate support disposed in the plasma processing chamber;

a matching box electrically connected to the substrate support;

a radio-frequency (RF) power source electrically connected to the matching box to generate a periodic RF pulse that includes a first power level, a second power level, and a third power level; and a controller, wherein the controller is configured to:

calculate a load impedance based on a reflected power of the RF pulse in each of a first time interval during which the first power level is supplied, a second time interval during which the second power level is supplied, and a third time interval during which the third power level is supplied, and control a matching element included in the matching box based on the load impedance calculated in each of the first time interval, the second time interval, and the third time interval.

APPENDIX 2

The plasma processing system according to Appendix 1, in which the controller is further configured to:

calculate a first weight based on the first power level, a second weight based on the second power level, and a third weight based on the third power level, calculate a total value of a product of a first load impedance and the first weight in the first time interval, a product of a second load impedance and the second weight in the second time interval, and a product of a third load impedance and the third weight in the third time interval, and control the matching element included in the matching box to match the total value with an output impedance of the RF power source.

APPENDIX 3

The plasma processing system according to Appendix 2, in which the first weight is determined by the first power level relative to a total value of the first power level, the second power level, and the third power level, the second weight is determined by the second power level relative to the total value of the first power level, the second power level, and the third power level, and the third weight is determined by the third power level relative to the total value of the first power level, the second power level, and the third power level.

APPENDIX 4

The plasma processing system according to Appendix 2 or 3, in which the controller performs a processing including:

a first processing that calculates a variation in the reflected power over each of the first time interval, the second time interval, and the third time interval, a second processing that recalculates a variation in the reflected power over each of the first time interval, the second time interval, and the third time interval, following controlling the matching element included in the matching box based on the first load impedance, the second load impedance, and the third load impedance, and a third processing that repeats the first processing and the second processing in sequential order until a difference between the variation in the reflected power calculated in the first processing and the variation in the reflected power calculated in the second processing is less than a predetermined value.

APPENDIX 5

The plasma processing system according to Appendix 4, in which the variation is a standard deviation of values of the reflected power over each of the first time interval, the second time interval, and the third time interval.

APPENDIX 6

The plasma processing system according to any one of Appendixes 1 to 5, in which the RF power source has a first power supply that supplies first RF power for plasma generation and a second RF power supply that supplies second RF power for bias having a frequency lower than a frequency of the first RF power, the matching box has a first matching box electrically connected to the first power supply and a second matching box electrically connected to the second power supply, and at least either one of the first power supply or the second power supply generates the periodic RF pulse that includes the first power level, the second power level, and the third power level.

APPENDIX 7

The plasma processing system according to Appendix 6, further including:

a showerhead including an electrode and configured to supply a gas into the plasma processing chamber, wherein the substrate support includes an electrode, the first power supply supplies the first RF power to at least one of the electrode of the showerhead or the electrode of the substrate support, and the second power supply supplies the second RF power to at least one of a base of the substrate support or an electrode in an electrostatic chuck of the substrate support.

APPENDIX 8

A plasma processing method executed by a plasma processing system including:

a plasma processing chamber;

a substrate support disposed in the plasma processing chamber;

a matching box electrically connected to the substrate support;

an RF power source electrically connected to the matching box to generate a periodic RF pulse that includes a first power level, a second power level, and a third power level; and a controller, the plasma processing method including:

(a) calculating a load impedance based on a reflected power of the RF pulse in each of a first time interval during which the first power level is supplied, a second time interval during which the second power level is supplied, and a third time interval during which the third power level is supplied, and (b) controlling a matching element included in the matching box based on the load impedance calculated in each of the first time interval, the second time interval, and the third time interval.

APPENDIX 9

The plasma processing method according to Appendix 8, in which (b) includes:

calculating a first weight based on the first power level, a second weight based on the second power level, and a third weight based on the third power level, calculating a total value of a product of a first load impedance and the first weight in the first time interval, a product of a second load impedance and the second weight in the second time interval, and a product of a third load impedance and the third weight in the third time interval, and controlling the matching element included in the matching box to match the total value with an output impedance of the RF power source.

APPENDIX 10

The plasma processing method according to Appendix 9, in which the first weight is determined by the first power level relative to a total value of the first power level, the second power level, and the third power level, the second weight is determined by the second power level relative to the total value of the first power level, the second power level, and the third power level, and the third weight is determined by the third power level relative to the total value of the first power level, the second power level and the third power level.

APPENDIX 11

The plasma processing method according to any one of Appendixes 8 to 10, further including:

(c) calculating a variation in the reflected power over each of the first time interval, the second time interval, and the third time interval, before (a) and (b);

(d) recalculating a variation in the reflected power over each of the first time interval, the second time interval, and the third time interval, after (a) and (b); and (e) repeating (c), (a), (b), and (d) recalculating in sequential order until a difference between the variation in the reflected power calculated in (a) and the variation in the reflected power calculated in (b) is less than a predetermined value.

APPENDIX 12

The plasma processing method according to Appendix 11, in which the variation is a standard deviation of values of the reflected power over each of the first time interval, the second time interval, and the third time interval.

APPENDIX 13

The plasma processing method according to any one of Appendixes 8 to 12, in which the RF power source has a first power supply that supplies first RF power for plasma generation and a second RF power supply that supplies second RF power for bias having a frequency lower than a frequency of the first RF power, the matching box has a first matching box electrically connected to the first power supply and a second matching box electrically connected to the second power supply, and at least either one of the first power supply or the second power supply generates the periodic RF pulse that includes the first power level, the second power level, and the third power level.

APPENDIX 14

The plasma processing method according to Appendix 13, in which the plasma processing system further includes a showerhead including an electrode and configured to supply a gas into the plasma processing chamber, the substrate support includes an electrode, the first power supply supplies the first RF power to at least one of the electrode of the showerhead or the electrode of the substrate support, and the second power supply supplies the second RF power to at least either one of a base of the substrate support or an electrode in an electrostatic chuck of the substrate support.

According to various aspects and embodiments of the present disclosure, it is possible to achieve more stable maintenance of plasma during processing using plasma.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing system comprising:
- a plasma processing chamber,
- a substrate support disposed in the plasma processing chamber;
- a matching box electrically connected to the substrate support;
- a radio-frequency (RF) power source electrically connected to the matching box to generate a periodic RF pulse that includes a first power level, a second power level, and a third power level; and
- a controller, wherein the controller is configured to:
- calculate a load impedance based on a reflected power of the RF pulse in each of a first time interval during which the first power level is supplied, a second time interval during which the second power level is supplied, and a third time interval during which the third power level is supplied, and
- control a matching element included in the matching box based on the load impedance calculated in each of the first time interval, the second time interval, and the third time interval, including:
  - calculate a first weight based on the first power level,
  - calculate a second weight based on the second power level,
  - calculate a third weight based on the third power level,
  - calculate a first product of (i) a first load impedance in the first time interval during which the first power level is supplied and (ii) the first weight based on the first power level in the first time interval,
  - calculate a second product of (i) a second load impedance in the second time interval during which the second power level is supplied and (ii) the second weight based on the second power level in the second time interval,
  - calculate a third product of (i) a third load impedance in the third time interval during which the third power level is supplied and (iii) the third weight based on the third power level in the third time interval,
  - calculate a total value of the first product, the second product, and the third product, and
  - control the matching element included in the matching box to match the total value of the first product, the second product, and the third product with an output impedance of the RF power source.

2. The plasma processing system according to claim 1, wherein
- the first weight is determined by the first power level relative to a total value of the first power level, the second power level, and the third power level,
- the second weight is determined by the second power level relative to the total value of the first power level, the second power level, and the third power level, and
- the third weight is determined by the third power level relative to the total value of the first power level, the second power level, and the third power level.

3. The plasma processing system according to claim 2, wherein the controller performs a processing including:
- a first processing that calculates a variation in the reflected power over each of the first time interval, the second time interval, and the third time interval,
- a second processing that recalculates a variation in the reflected power over each of the first time interval, the second time interval, and the third time interval, following controlling the matching element included in the matching box based on the first load impedance, the second load impedance, and the third load impedance, and
- a third processing that repeats the first processing and the second processing in sequential order until a difference between the variation in the reflected power calculated in the first processing and the variation in the reflected power calculated in the second processing is less than a predetermined value.

4. The plasma processing system according to claim 3, wherein the variation is a standard deviation of values of the reflected power over each of the first time interval, the second time interval, and the third time interval.

5. The plasma processing system according to claim 1, wherein
- the RF power source has a first power supply that supplies a first RF power for plasma generation and a second RF power supply that supplies a second RF power for bias having a frequency lower than a frequency of the first RF power,
- the matching box has a first matching box electrically connected to the first power supply and a second matching box electrically connected to the second power supply, and
- at least either one of the first power supply or the second power supply generates the periodic RF pulse that includes the first power level, the second power level, and the third power level.

6. The plasma processing system according to claim 5, further comprising:
- a showerhead including an electrode and configured to supply a gas into the plasma processing chamber, wherein
- the substrate support includes an electrode,
- the first power supply supplies the first RF power to at least one of the electrode of the showerhead or the electrode of the substrate support, and
- the second power supply supplies the second RF power to at least one of a base of the substrate support or an electrode in an electrostatic chuck of the substrate support.

7. The plasma processing system of claim 1, wherein the controller is configured to determine the first load impedance, the second load impedance, and the third load impedance in a latter portion of each of the respective first time interval, second time interval, and third time interval after a plasma condition in the plasma processing chamber stabilizes.

8. The plasma processing system of claim 1, wherein the third power level is zero.

9. The plasma processing system of claim 1, wherein
- the third time interval has a longer duration than the first time interval, and
- the first time interval has a longer duration than the second time interval.

10. The plasma processing system of claim 1, wherein
- the matching element comprises a plurality of controllable reactance elements, and
- the controller is configured to adjust the reactance values of the controllable reactance elements to match the total value of the first product, the second product, and the third product with the output impedance of the RF power source.

11. A plasma processing method comprising:

(a) providing a plasma processing system including:

a plasma processing chamber;

a substrate support disposed in the plasma processing chamber;

a matching box electrically connected to the substrate support;

an RF power source electrically connected to the matching box to generate a periodic RF pulse that includes a first power level, a second power level, and a third power level; and a controller, (b) calculating a load impedance based on a reflected power of the RF pulse in each of a first time interval during which the first power level is supplied, a second time interval during which the second power level is supplied, and a third time interval during which the third power level is supplied, and (c) controlling a matching element included in the matching box based on the load impedance calculated in each of the first time interval, the second time interval, and the third time interval, including:

calculating a first weight based on the first power level, calculating a second weight based on the second power level, calculating a third weight based on the third power level, calculating a first product of (i) a first load impedance in the first time interval during which the first power level is supplied and (ii) the first weight based on the first power level in the first time interval, calculating a second product of (i) a second load impedance in the second time interval during which the second power level is supplied and (ii) the second weight based on the second power level in the second time interval, calculating a third product of (i) a third load impedance in the third time interval during which the third power level is supplied and (iii) the third weight based on the third power level in the third time interval, calculating a total value of the first product, the second product, and the third product, and controlling the matching element included in the matching box to match the total value of the first product, the second product, and the third product with an output impedance of the RF power source.

12. The plasma processing method according to claim 11, wherein the first weight is determined by the first power level relative to a total value of the first power level, the second power level, and the third power level, the second weight is determined by the second power level relative to the total value of the first power level, the second power level, and the third power level, and the third weight is determined by the third power level relative to the total value of the first power level, the second power level and the third power level.

13. The plasma processing method according to claim 11, further comprising:

(d) calculating a variation in the reflected power over each of the first time interval, the second time interval, and the third time interval, before (b) and (c);

(e) recalculating a variation in the reflected power over each of the first time interval, the second time interval, and the third time interval, after (b) and (c); and (f) repeating (d), (b), (c), and (e) in sequential order until a difference between the variation in the reflected power calculated in (d) and the variation in the reflected power calculated in (e) is less than a predetermined value.

14. The plasma processing method according to claim 13, wherein the variation is a standard deviation of values of the reflected power over each of the first time interval, the second time interval, and the third time interval.

15. The plasma processing method according to claim 11, wherein the RF power source has a first power supply that supplies first RF power for plasma generation and a second RF power supply that supplies second RF power for bias having a frequency lower than a frequency of the first RF power, the matching box has a first matching box electrically connected to the first power supply and a second matching box electrically connected to the second power supply, and at least either one of the first power supply or the second power supply generates the periodic RF pulse that includes the first power level, the second power level, and the third power level.

16. The plasma processing method according to claim 15, wherein the plasma processing system further includes a showerhead including an electrode and configured to supply a gas into the plasma processing chamber, the substrate support includes an electrode, the first power supply supplies the first RF power to at least either one of the electrode of the showerhead or the electrode of the substrate support, and the second power supply supplies the second RF power to at least either one of a base of the substrate support or an electrode in an electrostatic chuck of the substrate support.

* * * * *